US005864310A

United States Patent [19]
Khorramabadi

[11] Patent Number: 5,864,310
[45] Date of Patent: Jan. 26, 1999

[54] WIRELESS RECEIVER WITH OFFSET COMPENSATION USING FLASH-ADC

[75] Inventor: Haideh Khorramabadi, Palo Alto, Calif.

[73] Assignee: Philips Electronics North America Corporation, New York, N.Y.

[21] Appl. No.: 822,962

[22] Filed: Mar. 21, 1997

[51] Int. Cl.[6] .................................................. H03M 1/10
[52] U.S. Cl. ........................................... 341/118; 341/110
[58] Field of Search ..................................... 341/118, 120, 341/110, 156, 155, 172

[56] References Cited

U.S. PATENT DOCUMENTS

| | | | |
|---|---|---|---|
| 3,906,488 | 9/1975 | Suarez-Gartner | 341/172 |
| 4,282,515 | 8/1981 | Patterson, III | 341/118 |
| 4,590,458 | 5/1986 | Evans et al. | 341/118 |
| 5,394,148 | 2/1995 | Matsuura et al. | 341/162 |
| 5,426,431 | 6/1995 | Ryu | 341/158 |
| 5,436,629 | 7/1995 | Mangelsdorf | 341/156 |
| 5,463,395 | 10/1995 | Sawai | 341/156 |

OTHER PUBLICATIONS

1997 IEEE International Solid–State Circuits Conference, ISSCC97/ Session 21, Amplifiers/ Paper SA 21.3, "A HIGH PERFORMANCE AUTOZEROED CMOS OPAMP WITH 50 UV OFFSET" Francios Krummenacher, Reze Vafadar, Apparajan Ganesan, Vlado Valence, 0–7803–3721–2/ 1997, pp. 350–351.

*Primary Examiner*—Brian Young
*Assistant Examiner*—Peguy Jean Pierre
*Attorney, Agent, or Firm*—Dicran Halajian

[57] ABSTRACT

An analog signal processing system has an input, an analog processing path and an ADC. The offset of the processing path is measured digitally by the ADC by shorting the input to ground. The measured offset is stored in a register and used to modify the analog processing path in order to compensate for the offset.

14 Claims, 11 Drawing Sheets

WIRELESS RECEIVER WITH OFFSET COMPENSATION USING FLASH-ADC

FIELD OF THE INVENTION

The invention relates to a signal processing system that comprises a system input for receiving an analog input signal, a system output for providing a digital output signal, and a signal processing path between the system input and the system output. The processing path comprises analog signal processing means coupled to the system input for processing the analog signal, and an ADC with an ADC input and an ADC output. The ADC input is connected to the analog signal processing means for receiving the processed analog signal. The ADC output provides a digital output signal indicative of the processed analog signal and is coupled to the system output. The system further has compensation means for reducing an offset level induced in the processed analog signal by the analog signal processing means.

The invention also relates to a method of processing a signal.

The invention relates in particular, but not exclusively, to wireless receivers.

BACKGROUND ART

An example of a system as specified in the preamble is a wireless radio-frequency (RF) communication receiver. Such a receiver has to process signals with an extremely wide dynamic range. The dynamic range is the range of signal levels that can be processed without running into problems involving noise and signal distortion caused by clipping. The processing invariably entails high levels of amplification in the signal path. This poses major technical challenges towards the fully integrated implementation of RF receivers. Typically, offset levels, induced by device mismatch, can exceed by far received signal amplitudes.

Receiver stages are typically DC-coupled if the receiver is integrated in monolithic form. Problems associated with uncontrolled DC-offset include the requirement that the dynamic range of the ADC be significantly higher than that of an ADC with no offset compensation at all. Also, the offset could result in grossly distorted signals and high bit-error rates. This necessitates some form of DC-offset compensation in the receive path.

The most common technique used to compensate for offset effects is the trimming of the offset in the manufacturing environment. This has several drawbacks. First, the process of trimming tends to be expensive. Second, the stress imposed on the chip after packaging tends to shift the offset levels. This, often, forces the manufacturer to have the offset trimmed after packaging. Further complications arise from the fact that most critical tests have to be performed after DC-offset removal.

OBJECT OF THE INVENTION

It is an object of the invention to provide a more attractive offset compensation technique than is available in the current art.

SUMMARY OF THE INVENTION

To this end, the invention provides a signal processing system that comprises a system input for receiving an analog input signal, a system output for providing a digital output signal, and a signal processing path between the system input and the system output. The processing path comprises analog signal processing means coupled to the system input for processing the analog signal, and an ADC with an ADC input and an ADC output. The ADC input is connected to the analog signal processing means for receiving the processed analog signal. The ADC output provides a digital output signal indicative of the processed analog signal and is coupled to the system output. The system further has compensation means for reducing an offset level induced in the processed analog signal by the analog signal processing means. The compensation means comprises first means connected to the system input for temporarily fixing a level of the analog signal at the system input, and second means connected to the ADC output for storing the output signal associated with the fixed level. Third means are provided connected to the second means and to the signal processing path for affecting the signal processing after releasing the level, under control of the stored output signal.

The invention is based on the insight that the existing ADC can be used for providing an output signal in digital form that is representative of the offset induced by the analog path. This signal is then used to control the processing in order to reduce the undesired offset effects during operational use. The automatic offset cancellation technique according to the invention affects the manufacturing costs in several ways. First, the need for trimming in the factory has been eliminated. Second, the invention allows the manufacturer to perform most of the critical testing at the wafer level, and thus identify more of the rejects prior to packaging. This results in significant cost savings.

A preferred embodiment of the system according to the invention is characterized by the following features. The second means comprises a register for storing the output signal associated with the fixed level. The third means comprises a digital-to-analog converter (DAC) having a DAC input connected to the register, and having a DAC output for providing an analog correction signal under control of the stored output signal. The third means further comprises a modifying circuit. The modifying circuit has a first input connected to the DAC output for receipt of the correction signal, a second input connected to the analog signal processing means for receipt of the processed analog signal, and a circuit output connected to the ADC input for providing the processed analog signal modified under control of the correction signal. The ADC comprises a flash analog-to-digital converter (FADC) having a ladder of resistors. The DAC comprises an array of multiple switches, each respective one thereof coupled between a respective node in a respective pair of interconnected ones of the resistors and the first input of the modifying circuit, and control logic connected between the register and the array of multiple switches for selectively controlling the switches under control of the output signal stored in the register.

In the preferred embodiment, the resistor ladder of the FADC is used as a portion of a DAC.

The invention also relates to a method of signal processing. The method comprises receiving an analog input signal at an input, processing the analog input signal and converting the processed analog input signal into a digital output signal. The method further comprises temporarily fixing a level of the analog input signal at the input, and storing the digital output signal associated with the fixed level. Upon releasing the level, the signal processing is affected under control of the stored output signal. Preferably, the analog-to-digital conversion comprises using a flash-ADC having a ladder of resistors, and the affecting comprises generating an analog correction signal using selective controlling of multiple switches, each respective one connected between a respective pair of interconnected ones of the resistors and an analog output under control of the output signal stored.

BRIEF DESCRIPTION OF THE DRAWINGS

The invention is explained in further detail, by way of example and with reference to the accompanying drawings, wherein.

Throughout the figures, same reference numerals indicate similar or corresponding features.

PREFERRED EMBODIMENTS

System block diagram

Figure 1:
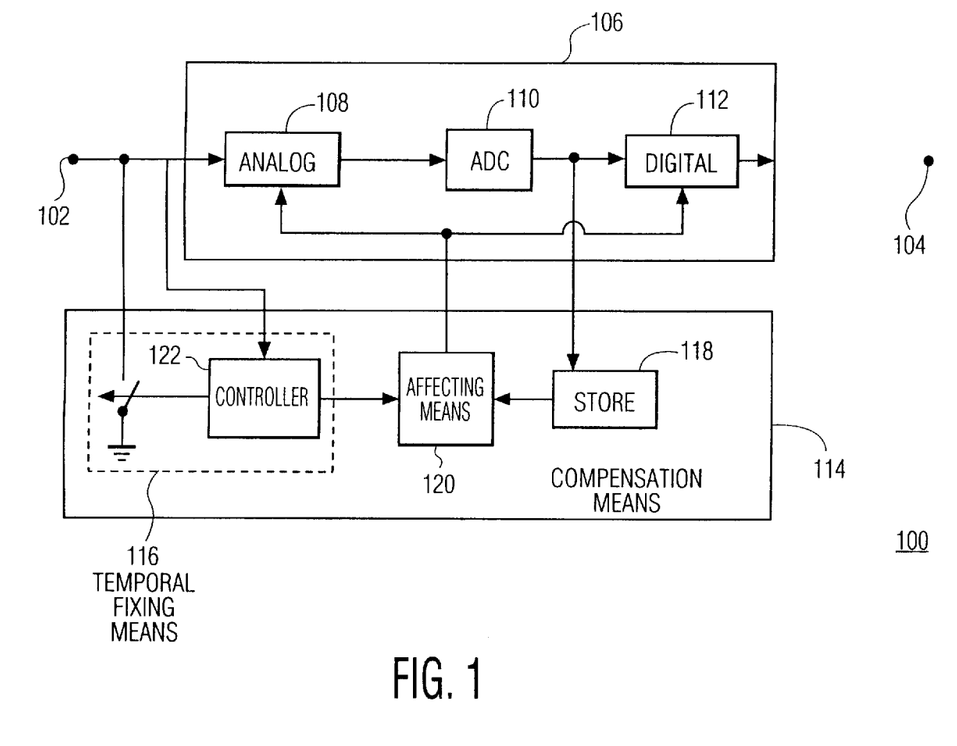
FIG. 1 is a block diagram of a system according to the invention.

FIG. 1 is a block diagram of a signal processing system 100 according to the invention. System 100 comprises a system input 102 for receiving an analog input signal, and a system output 104 for providing a digital output signal. System 100 has a signal processing path 106 between system input 102 and system output 104. Signal processing path 106 has analog signal processing means 108 coupled to system input 102 for processing the analog signal. Path 106 further has an analog-to-digital converter (ADC) 110. The ADC input is connected to analog signal processing means 108 for receiving the processed analog signal. The ADC output provides a digital output signal indicative of the processed analog signal and is coupled to system output 104, e.g., via further digital signal processing means 112. System 100 comprises compensation means 114 for reducing an offset level induced in the processed analog signal by analog signal processing means 108. Compensation means 114 comprises first means 116 connected to system input 102 for temporarily fixing a level of the analog signal at the system input. Compensation means 114 further has second means 118 connected to the ADC output for storing the output signal associated with the fixed level. This output signal is a representation of the offset incurred by the analog signal in analog processing part 108. Compensation means 114 has third means 120 connected to second means 118 and to the signal processing path 106 for affecting the signal processing after releasing the level, under control of the stored output signal in store 118, in order to reduce the undesired effects of the offset.

Affecting signal processing path 106 may take place at, e.g., analog processing part 108, or digital processing part 112, or both.

Fixing the level at input 102 temporarily can be done at fixed times, or under control of the analog signal itself received at input 102. In the latter case, the analog signal comprises, e.g., a precursor, preceding information content to be processed by analog processing part 108. The precursor is in existence a predetermined period of time. The precursor is detected by a controller 122 who then activates second means 118 to measure the offset and enables third means to affect the processing path during operational use of the system. Alternatively, in, e.g., a wireless receiver, the offset measurement can be done while in the sleep mode (receiver turned off) of the system, in the idle mode (turned-on and alert), in the receive mode (while receiving a signal, e.g., together with an error correction cycle that permits to miss a few bits), or when changing states between these modes.

Conventional system

Figure 2:
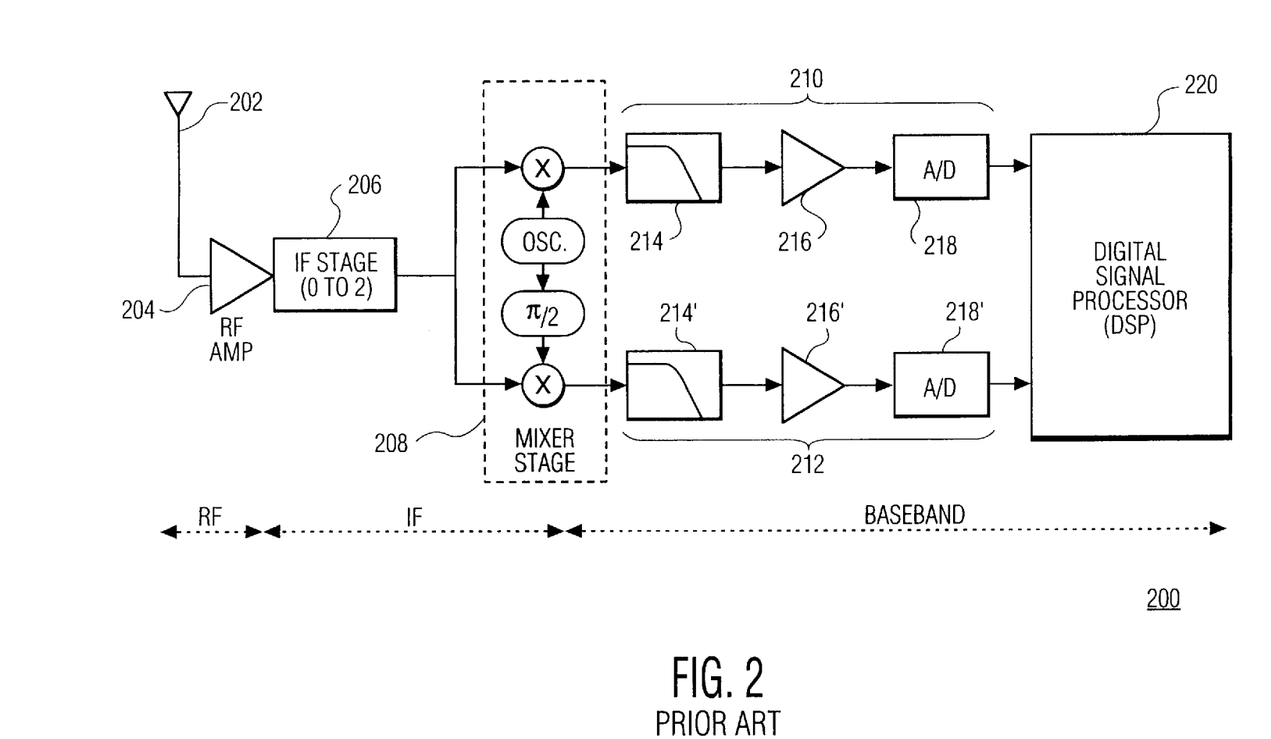
FIG. 2 is a block diagram of a conventional wireless receiver.

FIG. 2 is a block diagram of a signal processing system 200. In this example, system 200 comprises a wireless receiver. System 200 has an antenna 202 for receiving an RF input signal. Antenna 202 is connected to an input of an amplifier 204 for amplifying the RF signal received. Then, dependent on the architecture, the RF signal is either directly down-converted to the baseband, or is first mixed down to an intermediate frequency (IF) in a converter stage 206, followed by a conversion to baseband in a mixer stage 208. Typically, the final down-conversion includes the separation of the in-phase and quadrature components. System 200 comprises baseband receive paths 210 and 212. Baseband receive path 210 comprises a low-pass filter 214 to suppress the adjacent frequency channels. Path 210 comprises an amplifier 216 and an analog-to-digital converter (ADC) 218. ADC 218 provides the digital representative of the analog signal received at antenna 202 to a DSP 220 for further processing. Similar to path 210, path 212 also has a low-pass filter 214', an amplifier 216' and an ADC 218'.

Typically, the bulk of the receive path amplification is performed after the signal has been mixed down to the baseband in modern wireless transceivers. Accordingly, offset cancellation is required for the baseband portion of the receiver.

System in the invention

Figure 3:
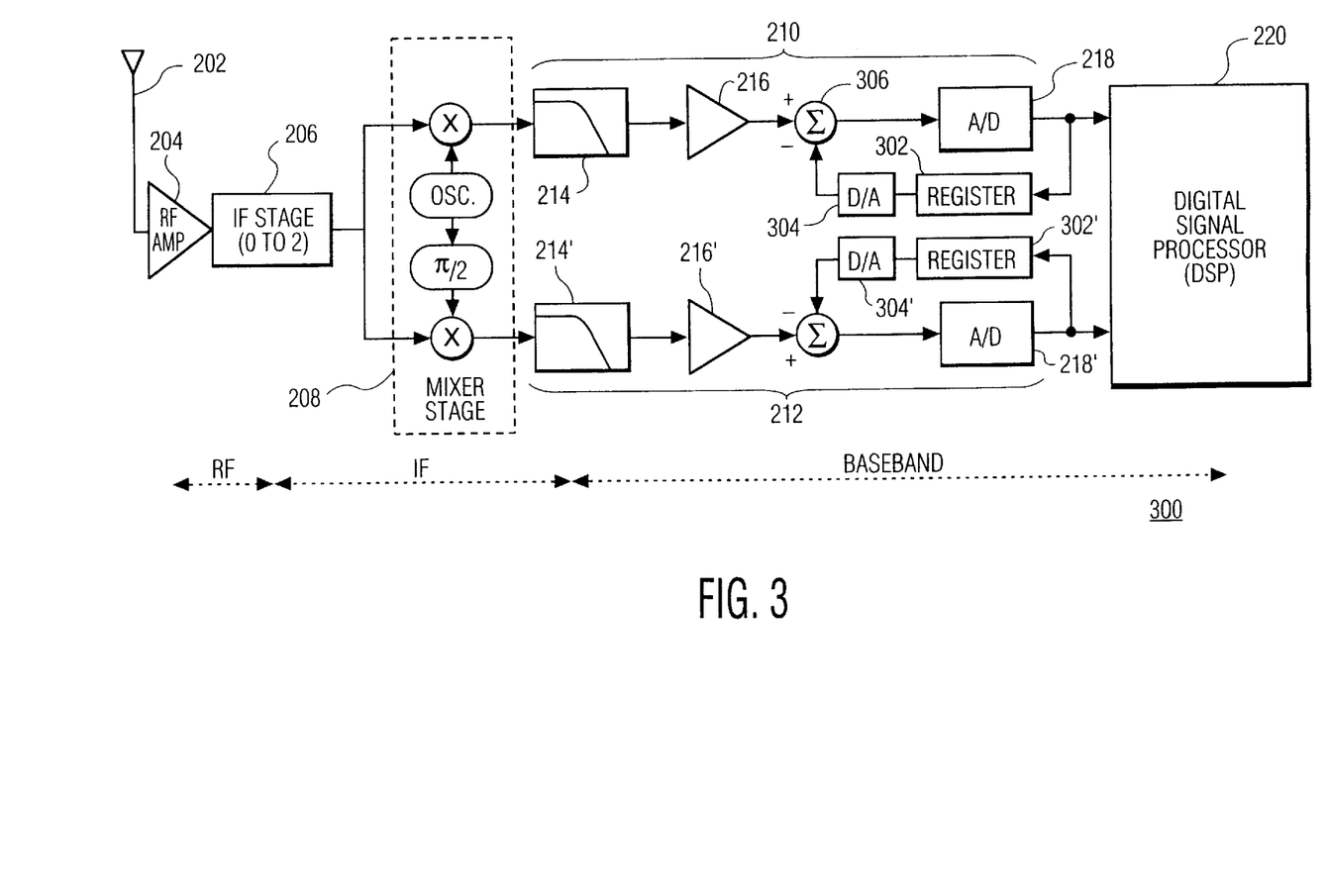
FIG. 3 is a block diagram of a wireless receiver in the invention.

FIG. 3 is a block diagram of a system 300 according to the invention. Path 210 of system 300 is now coupled to a register 302, a DAC 304 and a circuit 306 for generating an output signal that is, in this example, a linear combination of the signals received at its inputs. Register 302 is connected to an output of ADC 218. DAC 304 is connected between the output of register 302 and a first input of circuit 306. DAC 304 provides an offset correction signal. Circuit 306 has its second input connected to an output of amplifier 216, and has its output connected to an input of ADC 218. Similar to path 210, path 212 also has a register 302', a DAC 304' and a circuit 306'. Operation is explained with reference to FIGS. 4–5.

Block diagrams explaining operation

Figure 4:
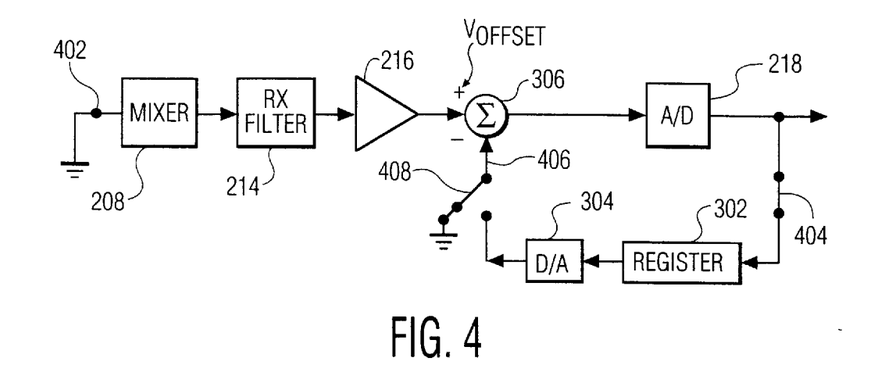
FIGS. 4 and 5 are block diagrams to explain operation of the receiver of the invention.
Figure 5:
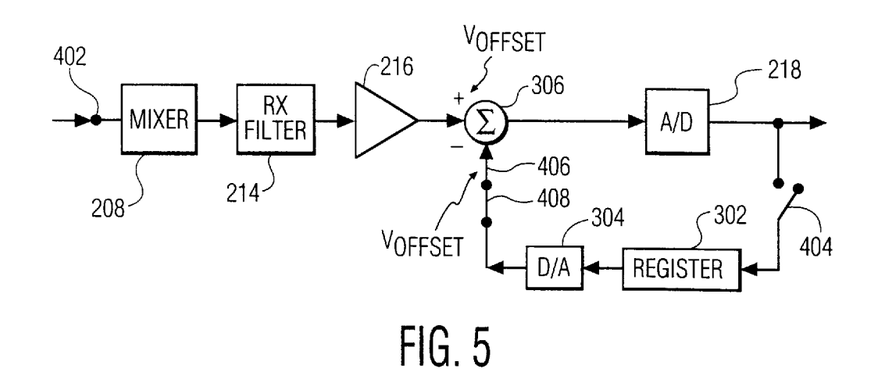

FIGS. 4 and 5 are block diagrams of parts of system 300 in order to explain the operation of the compensation method according to the invention.

Referring to FIG. 4, receiver 300 undergoes an offset cancellation cycle at the beginning of each signal processing session. This cancellation process starts with an input 402 of amplifier 204 or of mixer 208 being shorted. A first switch 404 between ADC 218 and register 302 is closed, and the offset correction signal at first input 406 of circuit 306 is set zero by a proper position of a second switch 408. As a result, the only signal now received at the input of ADC 218 is the overall receive path offset. ADC 218 thus provides an output signal that is the digitized representative of this offset. The digital output signal is stored in register 302.

Referring to FIG. 5, the digital representation of the offset as measured by ADC 218 is supplied to DAC 304 that creates an analog offset correction signal. First switch 404 is opened and second switch 408 interconnects DAC 304 and first input 406. The correction signal is combined with the received, amplified, mixed, filtered, and down-converted signal supplied by amplifier 216 to circuit 306 during the signal processing session. The offset correction signal remains constant throughout the rest of the session.

The output of DAC 304 is equal to the receive path offset with an accuracy limited by the A/D and D/A conversions.

Known CDMA receiver

Figure 6:
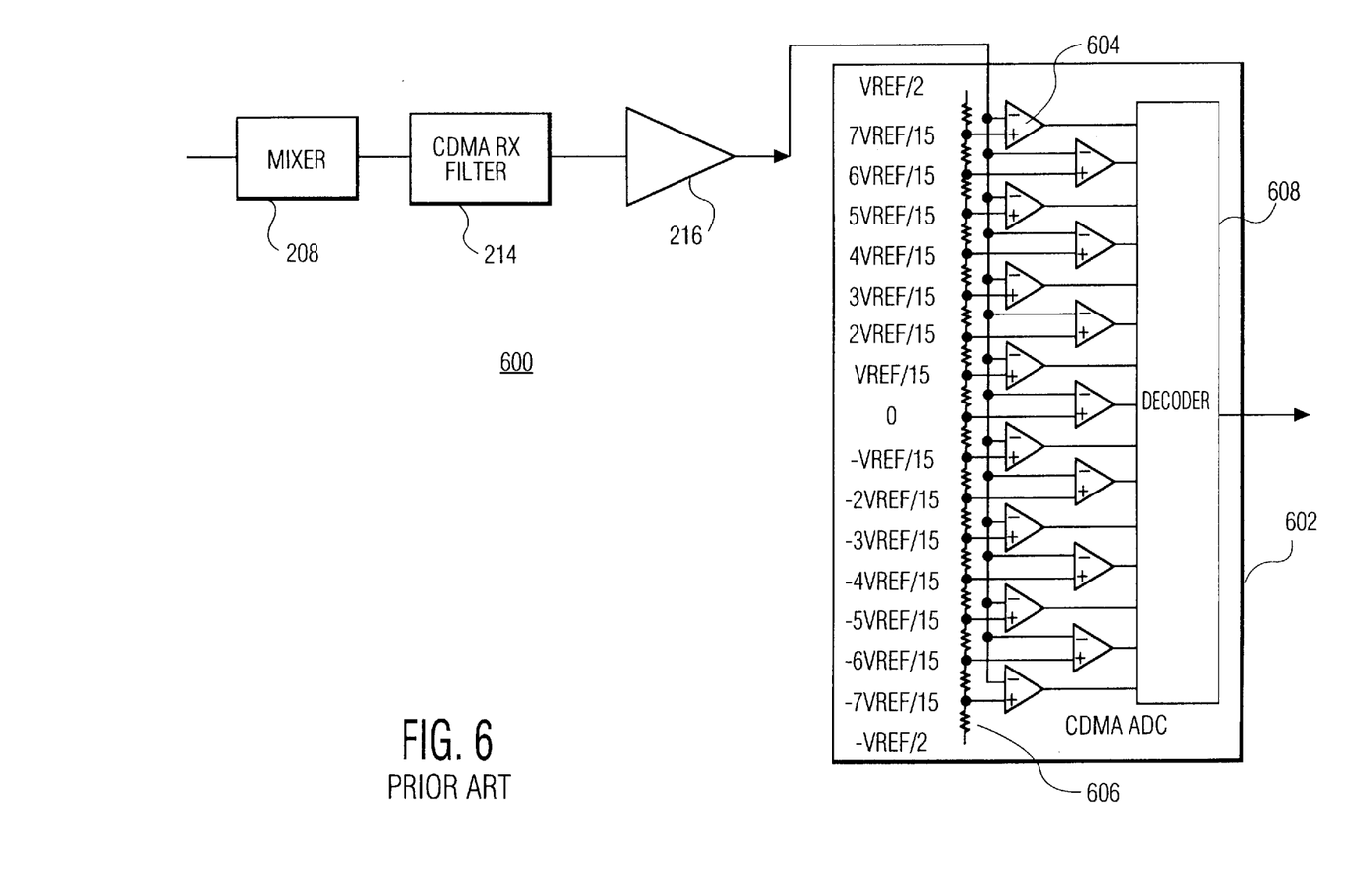
FIG. 6 is a block diagram of a known CDMA receiver.

FIG. 6 is a diagram of a part of a typical CDMA receiver 600, showing a portion of a single receive channel. One of the advantages of the CDMA communication technique is that the number of bits required for the A/D conversion is relatively low. A resolution of 4 or 5 bits for the A/D conversion is sufficient in most CDMA receiver implementations. Among various ADC architectures, the flash type ADC is well suited for applications where the required resolution is less than 6 bits.

FIG. 6 includes a block diagram of a 4-bit flash-ADC 602. An n-bit flash-type ADC comprises $2^n-1$ comparators, a resistor ladder comprising $2^n-1$ equal segments, and a decoder. In the array of comparators in the 4-bit version of FIG. 6, only comparator 604 is indicated by a reference numeral in order not to obscure the drawing. The resistor ladder is indicated by numeral 606, and the decoder by numeral 608. Resistor ladder 606 subdivides the main reference voltage $V_{ref}$ into $2^n-1$ equal spaced reference voltage levels. In the example of FIG. 6, where the A/D resolution is 4-bits, ladder 606 provides fifteen reference levels. The array of comparators compares the voltage received from amplifier 216 with these equally spaced voltages. For example, if the voltage supplied by amplifier 216 has a magnitude between $V_{ref}/15$ and $2V_{ref}/15$, the output of nine lower comparators is a logic high and the upper six have their outputs a logic low. This encoding scheme is commonly referred to as the thermometer code. The comparator outputs are then supplied to decoder 608 to generate the corresponding binary digital code. Typically, the output of each comparator is coupled to an associated one of the inputs of decoder via a flipflop (not shown), e.g., an edge-triggered D-flipflop, to secure signal integrity.

First embodiment of CDMA receiver in the invention

Figure 7:
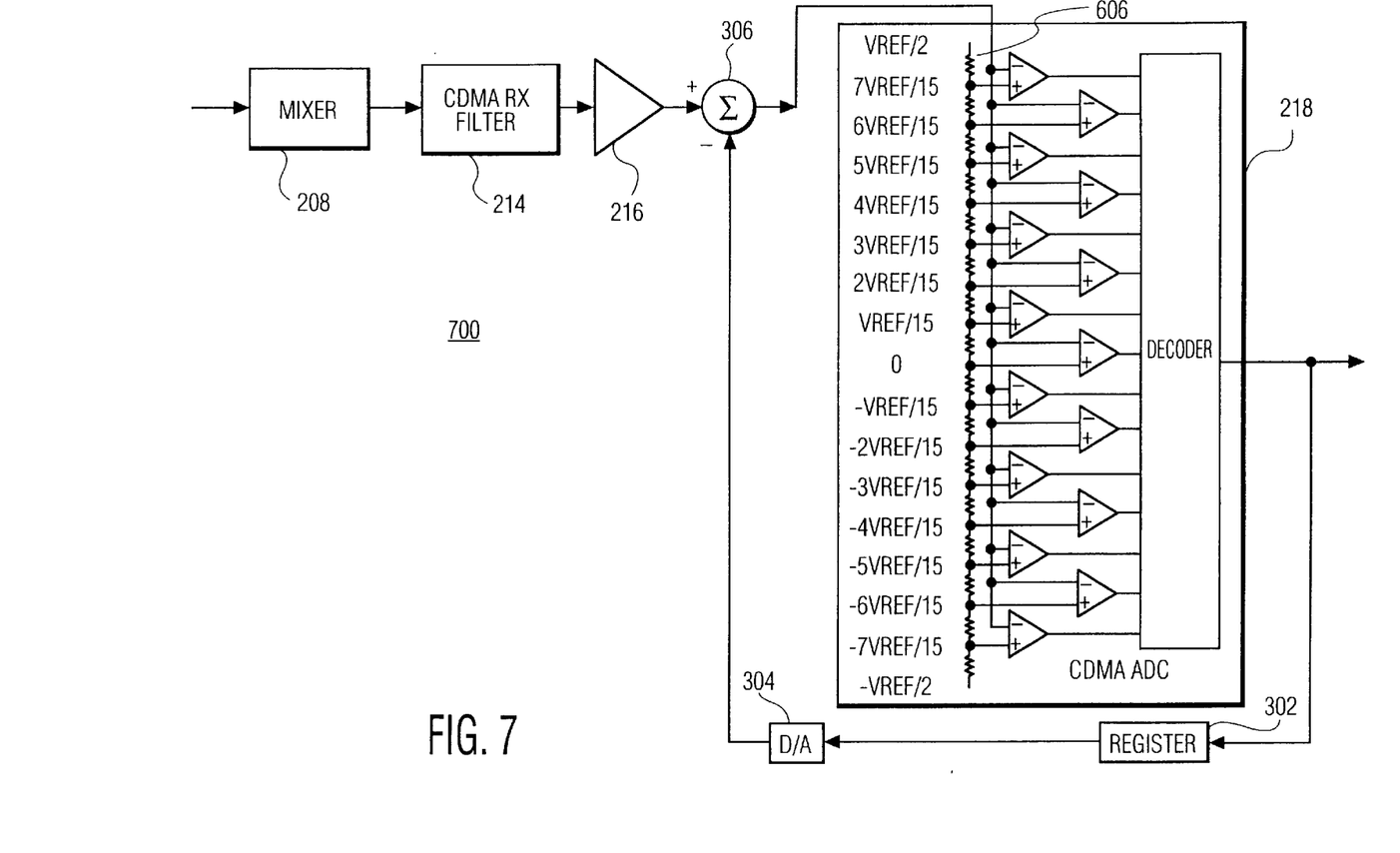
FIGS. 7–10 are diagrams of various embodiments for a CDMA receiver according to the invention.

FIG. 7 is a diagram of a part of a first embodiment of a CDMA receiver 700 according to the invention. As explained with reference to FIGS. 4 and 5, the input of amplifier 204 or mixer 208 is temporarily set to a fixed potential, e.g., shorted to ground. Also the offset correction signal supplied to circuit 306 is temporarily set to zero. ADC 218 then converts the offset component to its digital form. The digital offset representation is saved in register 302 and converted to analog form by DAC 304.

Second embodiment of CDMA receiver in the invention

Figure 8:
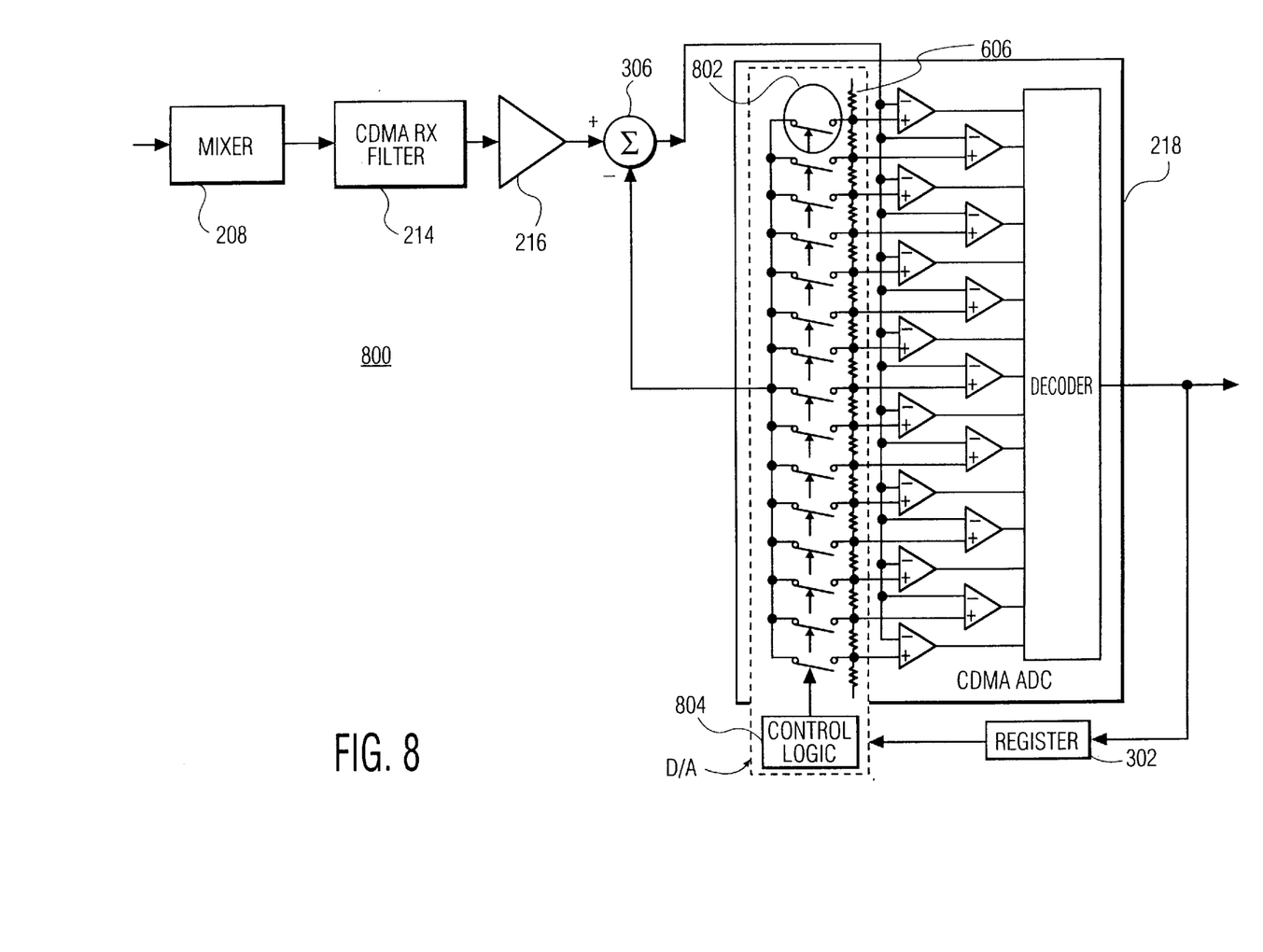

FIG. 8 is a diagram of a part of a second embodiment 800 of a CDMA receiver according to the invention. In embodiment 800, DAC 304 is functionally merged with ladder 606 of ADC 218. This merged configuration reduces power consumption of the overall system and, in an electronic system integrated in monolithic form, requires less real estate. This is especially relevant to handheld wireless receivers, since this reduction directly impacts maximum talk time and cost.

ADC 218 in embodiment 800 comprises an array of switches, e.g., CMOS switches, such as switch 802, and control logic 804. The combination of the switches and control logic 804 in combination with ladder 606 performs the function of DAC 304 in embodiment 700. Operation is as follows.

After each offset measurement, the content of register 302 is updated as explained above. Next, control logic 804 closes a particular one of the switches that is selected depending on the content of register 302. This closed one of the switches determines the voltage, and therefore the magnitude of the correction signal, that is supplied to the first input of circuit 306.

The maximum range of cancelable offsets is determined by the maximum levels of the reference voltage, which are identical to the full scale range of ADC 218. In most cases, the expected maximum offset is dominated by the offsets generated by the filters, e.g., filter 214. However, the worst-case expected offset level exceeds by far the maximum signal handling capability of ADC 218. This poses a limitation to the implementation of embodiment 800.

Third embodiment of CDMA receiver in the invention

Figure 9:
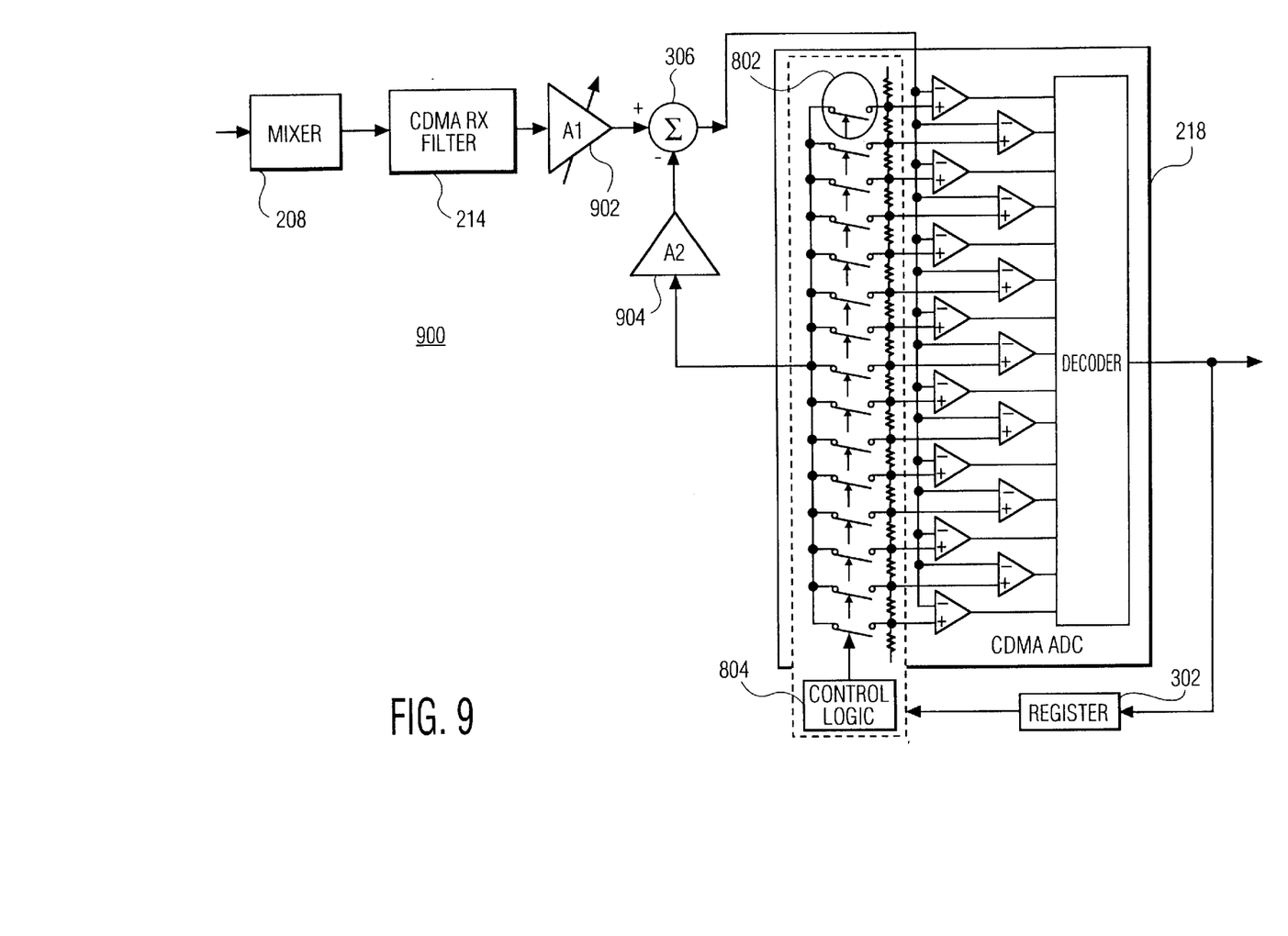

FIG. 9 is a diagram of a part of a third embodiment 900 of a CDMA receiver according to the invention. Embodiment 900 provides a solution to the problem indicated with reference to embodiment 800.

In embodiment 900, amplifier 216 is replaced with an amplifier 902 that has a first gain setting referred to as "a1" and a second gain setting referred to as "$a1_{cal}$". The magnitudes are such that "a1" is larger than "$a1_{cal}$". During the offset cancellation cycle, amplifier 902 is configured in the low gain mode with gain "$a1_{cal}$". The amount of gain reduction is chosen based on the expected maximum offset. The gain reduction factor $[a1/a1_{cal}]$ increases the maximum cancelable offset by a factor $[a1/a1_{cal}]$. Now, the resolution of the offset cancellation referred to the input of ADC 218 is $[V_{ref}/2^n-1]*[a1/a1_{cal}]$. Alternatively, or supplementarily, a second amplifier 904 can be used to amplify the analog correction signal provided by ADC 218.

Fourth embodiment of CDMA receiver in the invention

Figure 10:
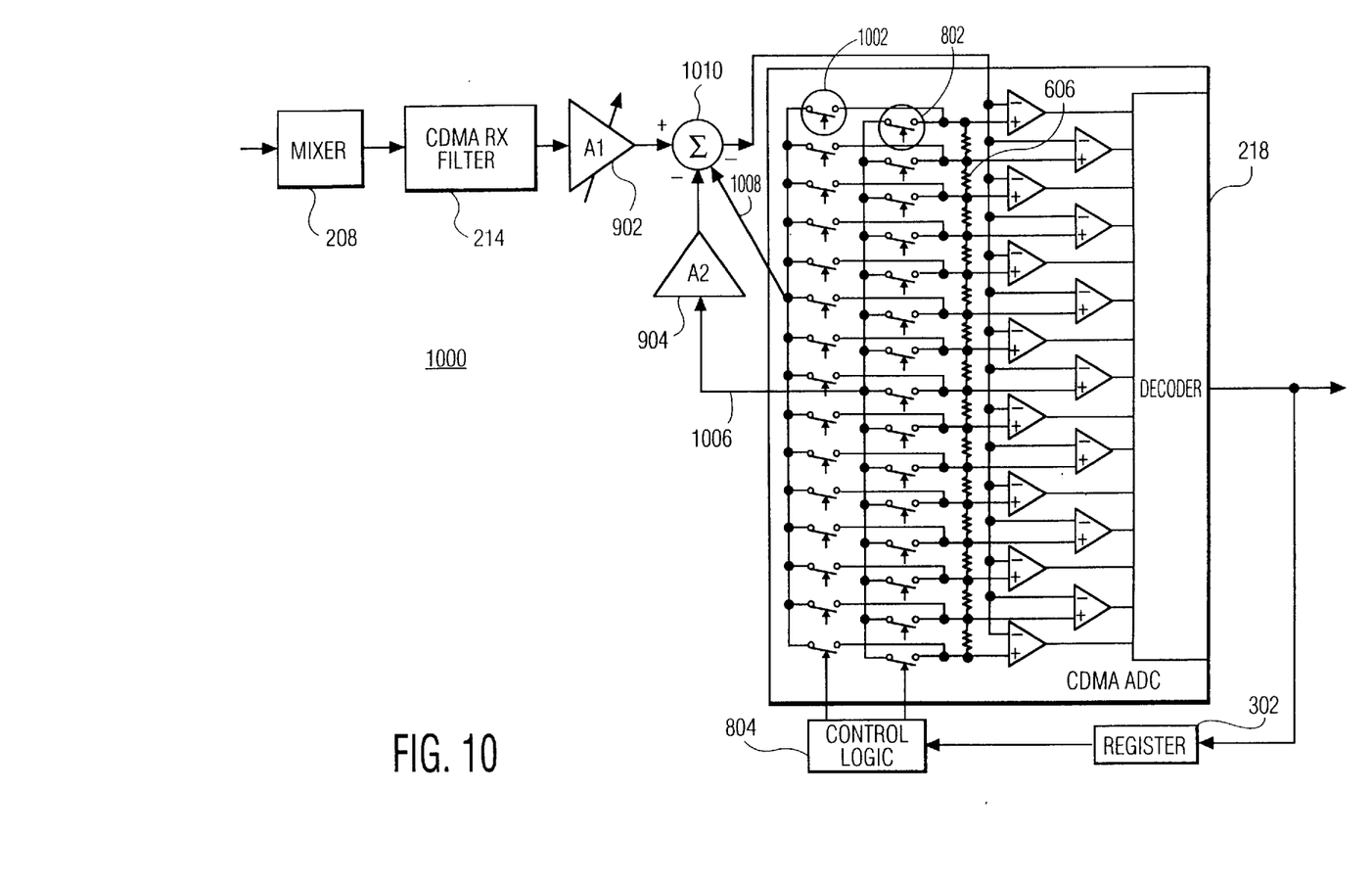

FIG. 10 is a diagram of a part of a fourth embodiment 1000 of a CDMA according to the invention. Compared to embodiment 900 of FIG. 9, embodiment 1000 has a further array of further switches connected to resistor ladder 606. Only further switch 1002 is indicated with a reference numeral in order not to obscure the drawing. Control logic 804 now controls both arrays of switches. Outputs 1006 and 1008 both supply analog correction signals to modifying circuit 1010.

Embodiment 1000 allows for a more refined offset correction adjustment. An initial coarse offset reduction phase is accompanied by a fine offset reduction phase. The first phase reduces the overall offset appearing at the input of ADC 218 to within the full scale range of ADC 218 as discussed above. Subsequently, fine offset cancellation is performed by repeating the calibration a second time. During the second measurement, the gain of amplifier 902 is set to its normal value "a1". Also, the gain associated with the second offset adjust feedback is unity. Note that the addition of the second phase reduces the offset adjustment resolution to $V_{ref}/[2^n-1]$. It is also possible to use this method for coarse offset cancellation only, and incorporate fine offset adjustment by having DSP 220 provide a feedback signal that is generated based on signal averaging.

Digital compensation

Figure 11:
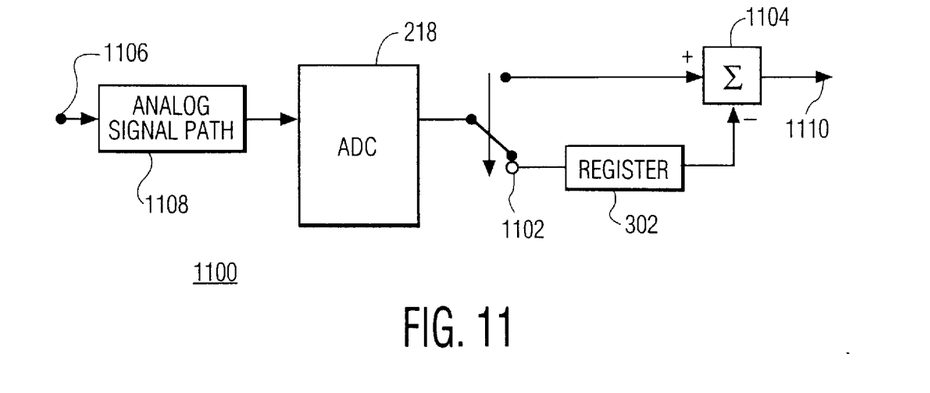
FIG. 11 is a block diagram of another type of system according to the invention.

FIG. 11 is a block diagram of part of a system 1100 in the invention. In embodiments 300, 700, 800, 900 and 1000 the offset cancellation is done in the analog domain. In system 1100, the offset cancellation is established in the digital domain. System 1100 comprises ADC 218, register 302, a switch 1102 connected to an output of ADC 218, and a digital modifying circuit 1104, e.g., a subtractor. Again, ADC 218 measures the offset after a node 1106 is shorted some place upstream in analog signal processing path 1108. With switch 1102 connected to register 302, the offset is stored in register 302. Then, switch 1102 is thrown to the other position, wherein ADC 218 is connected to modifying circuit 1104. An output 1110 of modifying circuit 1104 now provides a digital signal digitally compensated for the offset caused by analog signal path 1108.

Conventional cascaded ADC

Figure 12:
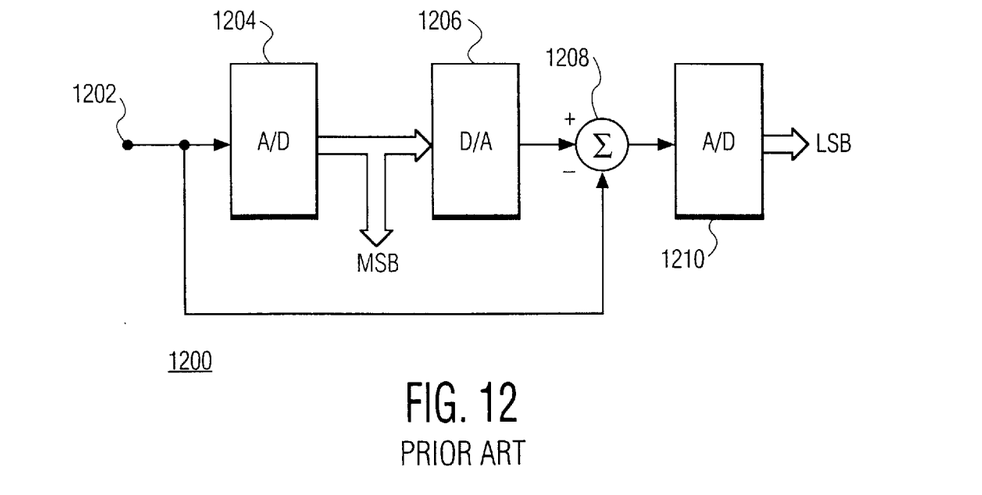
FIGS. 12–13 are diagrams of cascaded AD converters to explain a further aspect of the invention.

FIG. 12 is a diagram of a cascaded ADC 1200 known in the art. A drawback of flash ADC's is that the number of comparators required increases exponentially with the width of the digital output. Also, the resistor ladder is then required to provide more reference voltage levels. If the difference between successive reference voltages becomes too small, distinguishing between them becomes a problem and errors may be introduced. A cascaded ADC is a solution to this problem. In cascaded ADC 1200, the conversion of an analog signal at input 1202 is made in stages: first, the most significant bits (MSB) are determined by a first ADC 1204, e.g., of the flash-type. The MSB are then converted back again to an ancillary analog signal by DAC 1206. Both the analog signal as received at input 1202 and the ancillary signal are supplied to an analog subtractor 1208. Subtractor 1208 then provides a difference between the original and the ancillary analog signals to a second ADC 1210 for conversion to (a part of) the least significant bits (LSB). Accordingly, each of ADC's 1204 and 1210 only needs to be operational in a smaller range of analog input signals than a single ADC for the complete conversion would have to be.

Cascaded ADC according to the invention

Figure 13:
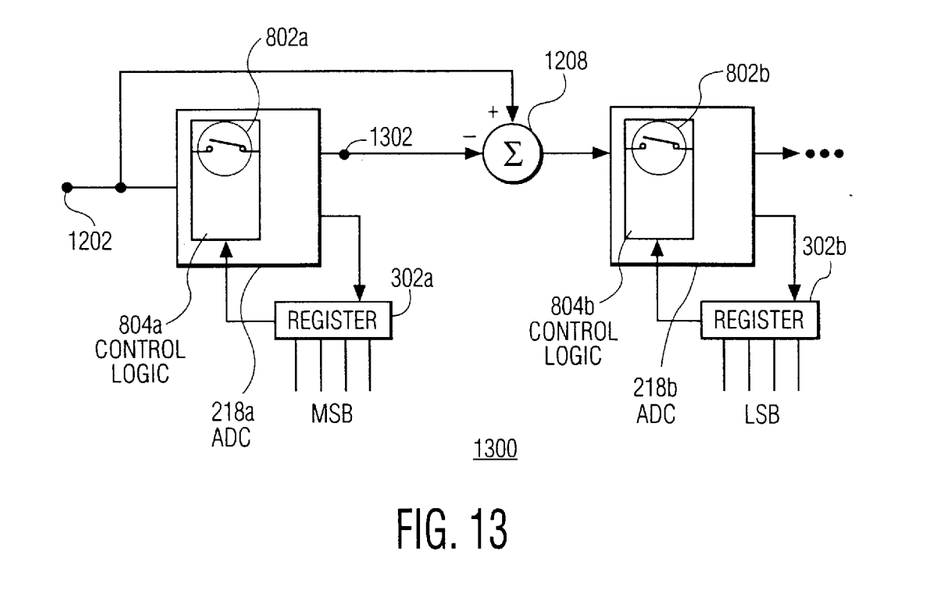

FIG. 13 is a block diagram of a cascaded ADC 1300 according to the invention. ADC 1300 is to convert an analog signal at input 1202 into a digital signal. ADC 1300 comprises at least two flash-ADC's 218a and 218b of the type as discussed with reference to, e.g., FIGS. 8–10. Each ADC 218a and 218b comprises a respective array of switches of which only switches 802a and 802b are shown, and control logic 804a and 804b. The array of switches in ADC 218a is controlled by control logic 804a depending on the content of register 302a. According to the particular one of the switches selected, ADC 218a provides an analog residu signal at output 1302 representative of the digital word in register 302a, here the MSB. The residu signal at output 1302 is subtracted from the analog signal at input 1202 in subtractor 1208. The resulting analog signal is supplied to a next ADC stage 218b, in this example a similar configuration as in the preceeding stage. The array of switches in ADC 218b is controlled by control logic 804b depending on the content of register 302b. The content of register 302b is the digital form of the analog result supplied by subtractor 1208, i.e., the LSB. If more stages are required, the cascade is extended with more stages such as the first one 218a. The last stage of the cascade need not include a flash-ADC of the type used for the preceding stages. ADC 1300 thus makes efficient use of the principle of the invention, wherein a flash-ADC can be used as a DAC.

I claim:

1. A signal processing system comprising:

a system input for receiving an analog input signal;

a system output for providing a digital output signal;

a signal processing path between the system input and the system output and comprising:

an analog signal processing means having a first input and a second input, said first input being coupled to the system input for processing the analog signal;

an analog-to-digital converter (ADC) with an ADC input and an ADC output, wherein:

the ADC input is connected to the analog signal processing means for receiving the processed analog signal; and the ADC output provides a digital output signal indicative of the processed analog signal and is coupled to the system output;

compensation means for reducing an offset level induced in the processed analog signal by the analog signal processing means, and comprising:

first means connected to the system for temporarily fixing a level of the analog signal at the system input and at the second input; and second means connected to the ADC output for storing the output signal associated with the fixed level; and third means connected to the second means and to the signal processing path for affecting the signal processing after releasing the level, under control of the stored output signal.

2. The system of claim 1, wherein:

the second means comprises a register for storing the output signal associated with the fixed level;

the third means comprises:

a digital-to-analog converter (DAC) having a DAC input connected to the register, and having a DAC output for providing an analog correction signal under control of the stored output signal; and a modifying circuit having a first input connected to the DAC output for receipt of the correction signal, a second input connected to the analog signal processing means for receipt of the processed analog signal, and a circuit output coupled to the ADC input for providing the processed analog signal modified under control of the correction signal.

3. The system of claim 2, wherein the third means comprises an amplifier in the signal processing path having an amplifier output connected to the second input of the modifying circuit;

the amplifier has first and second gain settings selectable through the first means.

4. The system of claim 3, wherein the third means comprises a second amplifier between the DAC and the first input of the modifying circuit.

5. The system of claim 2, wherein:

the ADC comprises a flash analog-to-digital converter (FADC) having a ladder of resistors;

the DAC comprises:

an array of multiple switches, each respective one thereof coupled between a respective node in a respective pair of interconnected ones of the resistors and the first input of the modifying circuit; and control logic connected between the register and the array for selectively controlling the switches depending on the output signal stored in the register.

6. The system of claim 5, wherein:

the modifying circuit has a further input for receiving a further correction signal;

the second means comprises a further array of multiple further switches, each respective one thereof coupled between a respective node in a respective pair of interconnected ones of the resistors and the further input; and the control logic is connected between the register and the further array for selectively controlling the further switches under control of the output signal stored in the register.

7. The system of claim 1, wherein the third means is connected to the signal processing path between the system output and the ADC output.

8. An electronic circuit with analog-to-digital converter means with a cascaded configuration, wherein the configuration comprises:

a configuration input for receiving an analog input signal;

a configuration output for providing a digital output signal;

first stage connected to the configuration input and comprising:
   a first ADC converter, being of the flash-type and having a ladder of resistors, and having a digital output for providing a digital output signal and an analog output for providing an analog output signal;
   an array of multiple switches, each respective one thereof coupled between a respective node in a respective pair of interconnected ones of the resistors and the analog output;
   a register connected to the digital output; and
   control logic connected between the register and the array for selectively controlling the switches depending on the output signal stored in the register;

a second stage having:
   a first analog input connected to the configuration input;
   a second analog input connected to the analog output;
   a subtracting circuit for subtracting the second analog input from the first analog input to provide, at a circuit output, a difference analog signal;
   a second ADC having an ADC input connected to the circuit output.

9. An electronic circuit having a circuit input and a circuit output comprising:

a subtracting circuit having a first input, a second input, and a difference output being the difference between said first and second inputs, said first input being connected to said circuit input;

an ADC with a flash analog-to-digital converter (FADC) having a ladder of resistors and being connected to said difference output;

an array of multiple switches, each respective one thereof coupled between a respective node in a respective pair of interconnected ones of the resistors and an output node, said output node being connected to said second input; and control logic connected to the array for selectively controlling the switches.

10. The circuit of claim 9, wherein:

the circuit comprises a further array of multiple further switches, each respective one thereof coupled between the respective node in the respective pair of interconnected ones of the resistors and a further output node; said further output node being connected to a third input of said subtracting circuit.

11. A method of signal processing, the method comprising:

receiving an analog input signal at a first input;

receiving an analog correction signal at a second input;

processing a corrected analog input signal resulting from a combination of said analog input signal and said analog correction signal;

converting the corrected analog input signal into a digital output signal, the method further comprising:
   temporality fixing a level of the analog input signal at the first input and of the analog correction signal at the second input;
   storing the digital output signal associated with the fixed level;
   releasing the level; and
   affecting the signal processing under control of the stored output signal after releasing the level.

12. The method of claim 11, wherein the affecting comprises:

creating the analog correction signal at the second input on the basis of the stored digital output signal; and modifying the processing of the analog input signal at the first input under control of the analog correction signal at the second input.

13. The method of claim 12, comprising:

amplifying the processed analog input signal by a first factor when the level is fixed;

amplifying the processed analog signal by a second factor different from the first upon release of the level.

14. The method of claim 12, wherein:

the converting comprises using a flash-ADC, the flash-ADC comprising a resistor ladder;

the creating comprises selectively tapping in the resistor ladder under control of the stored digital output signal.

* * * * *